United States Patent
Bach

(10) Patent No.: US 6,544,807 B1
(45) Date of Patent: Apr. 8, 2003

(54) PROCESS MONITOR WITH STATISTICALLY SELECTED RING OSCILLATOR

(75) Inventor: Randall Bach, Stillwater, MN (US)

(73) Assignee: LSI Logic Corporation, Milpitas, CA (US)

( * ) Notice: Subject to any disclaimer, the term of this patent is extended or adjusted under 35 U.S.C. 154(b) by 203 days.

(21) Appl. No.: 09/706,286

(22) Filed: Nov. 3, 2000

(51) Int. Cl.[7] ............................................... H01L 21/66
(52) U.S. Cl. ............................ 438/18; 438/17; 438/14
(58) Field of Search ..................... 438/18, 17; 324/763, 324/766, 765

(56) References Cited

U.S. PATENT DOCUMENTS

| | | | | |
|---|---|---|---|---|
| 5,068,547 A | * | 11/1991 | Gascoyne | .................. 324/617 |
| 5,686,855 A | * | 11/1997 | Lee | ............................. 327/175 |
| 5,798,649 A | * | 8/1998 | Smayling et al. | ............. 324/48 |
| 5,867,033 A | * | 2/1999 | Sporck et al. | .............. 324/763 |
| 5,903,012 A | * | 5/1999 | Boerstler | ..................... 257/551 |
| 6,124,143 A | * | 9/2000 | Sugasawara | ................. 324/713 |
| 6,400,595 B1 | * | 6/2002 | Keeth et al. | ................. 365/226 |

\* cited by examiner

*Primary Examiner*—John F Niebung
*Assistant Examiner*—Olivia T Luk
(74) *Attorney, Agent, or Firm*—Fitch, Even, Tabin & Flannery

(57) ABSTRACT

A process monitor includes a test circuit formed on a product die wherein the test circuit has a distribution of cell types that is substantially identical to that of the product die.

5 Claims, 5 Drawing Sheets

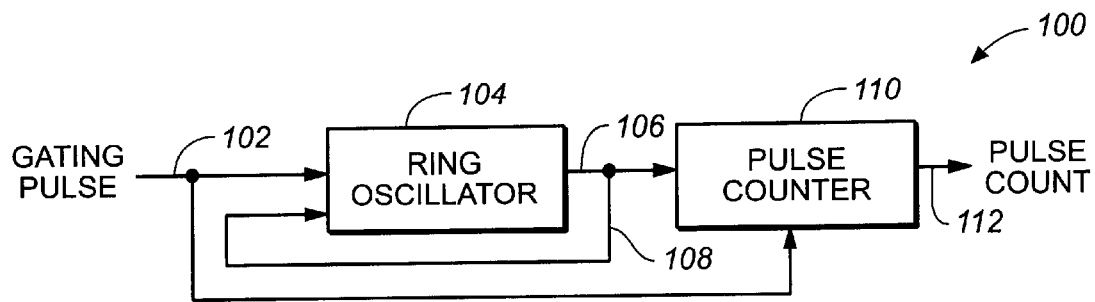
*FIG._1*
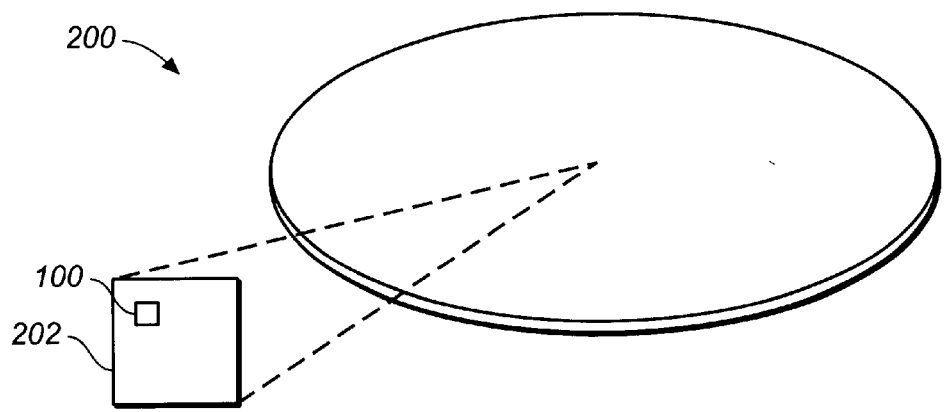
*FIG._2*
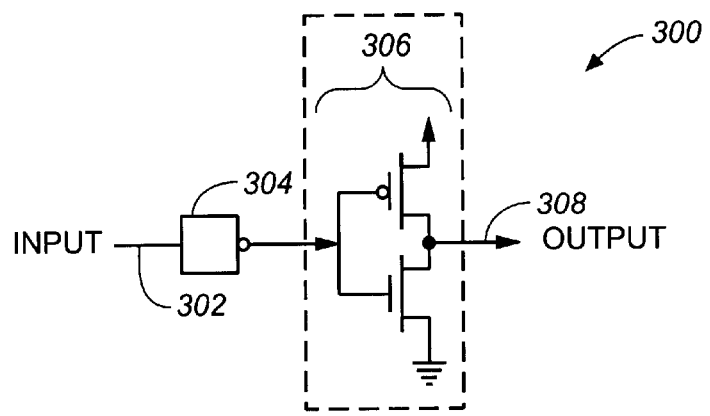
*FIG._3*

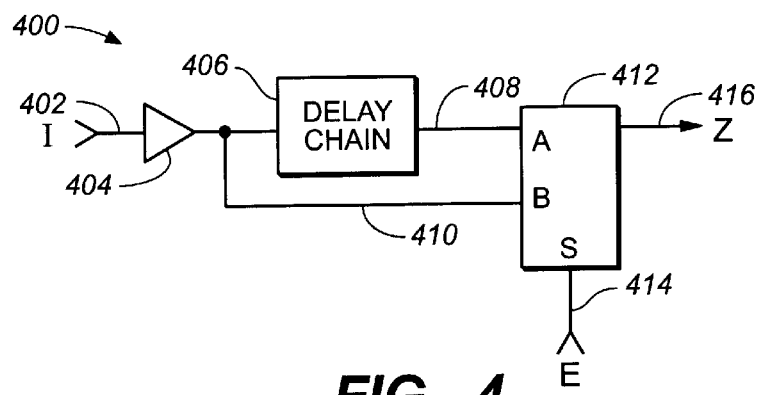
FIG._4
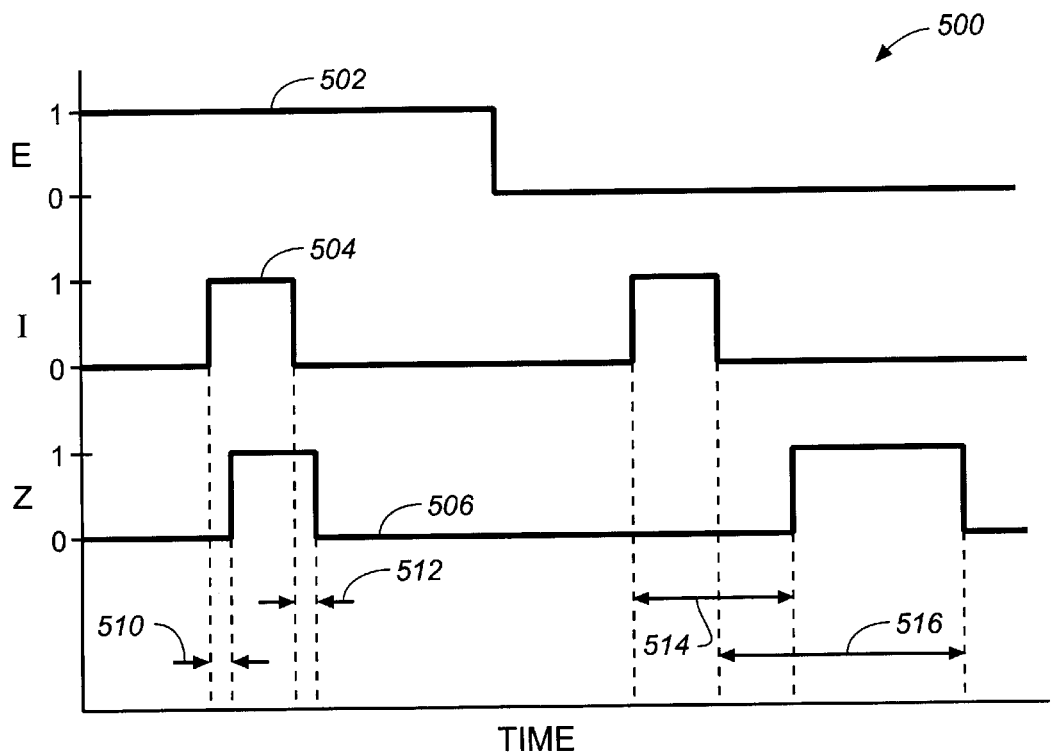
FIG._5

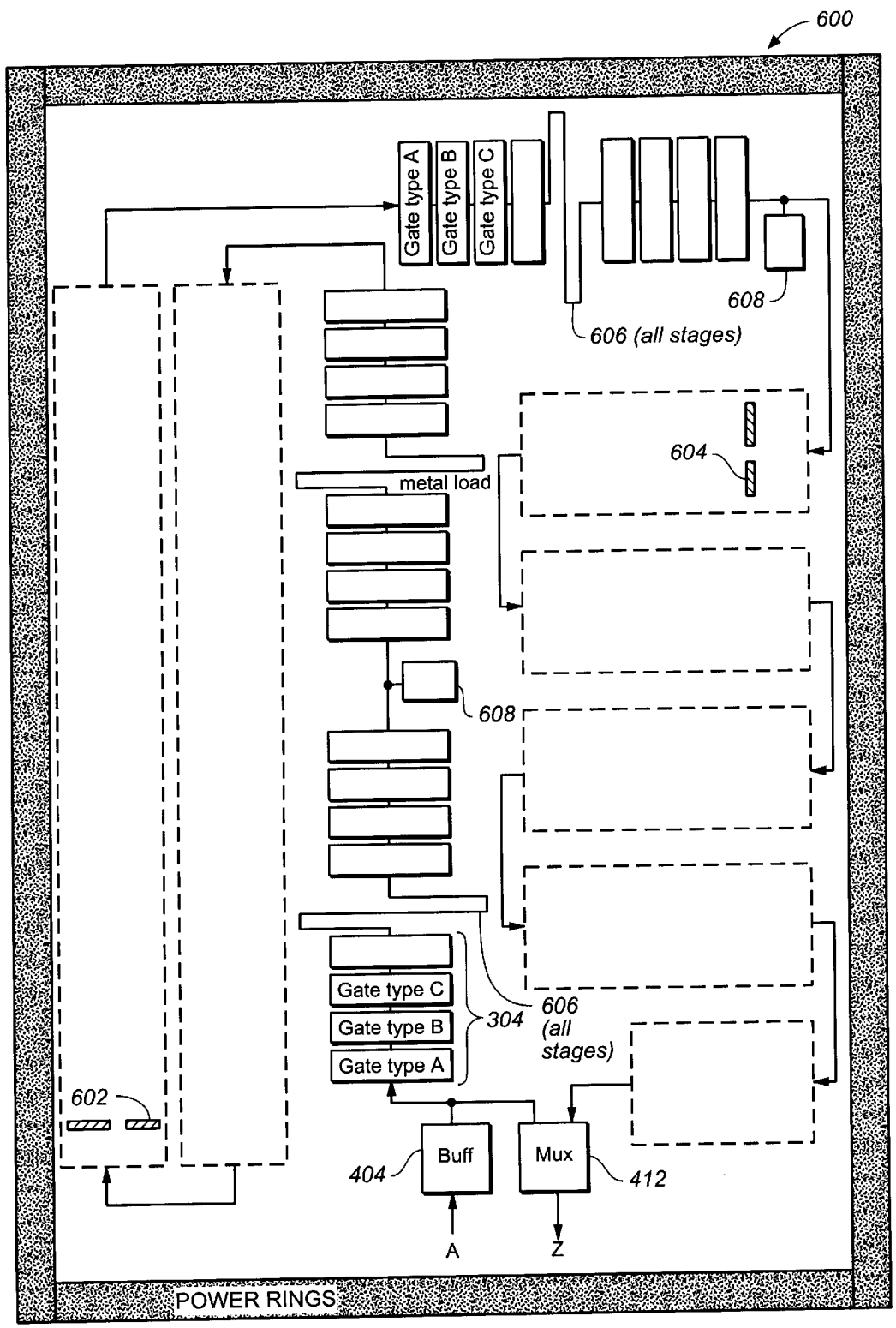
FIG._6

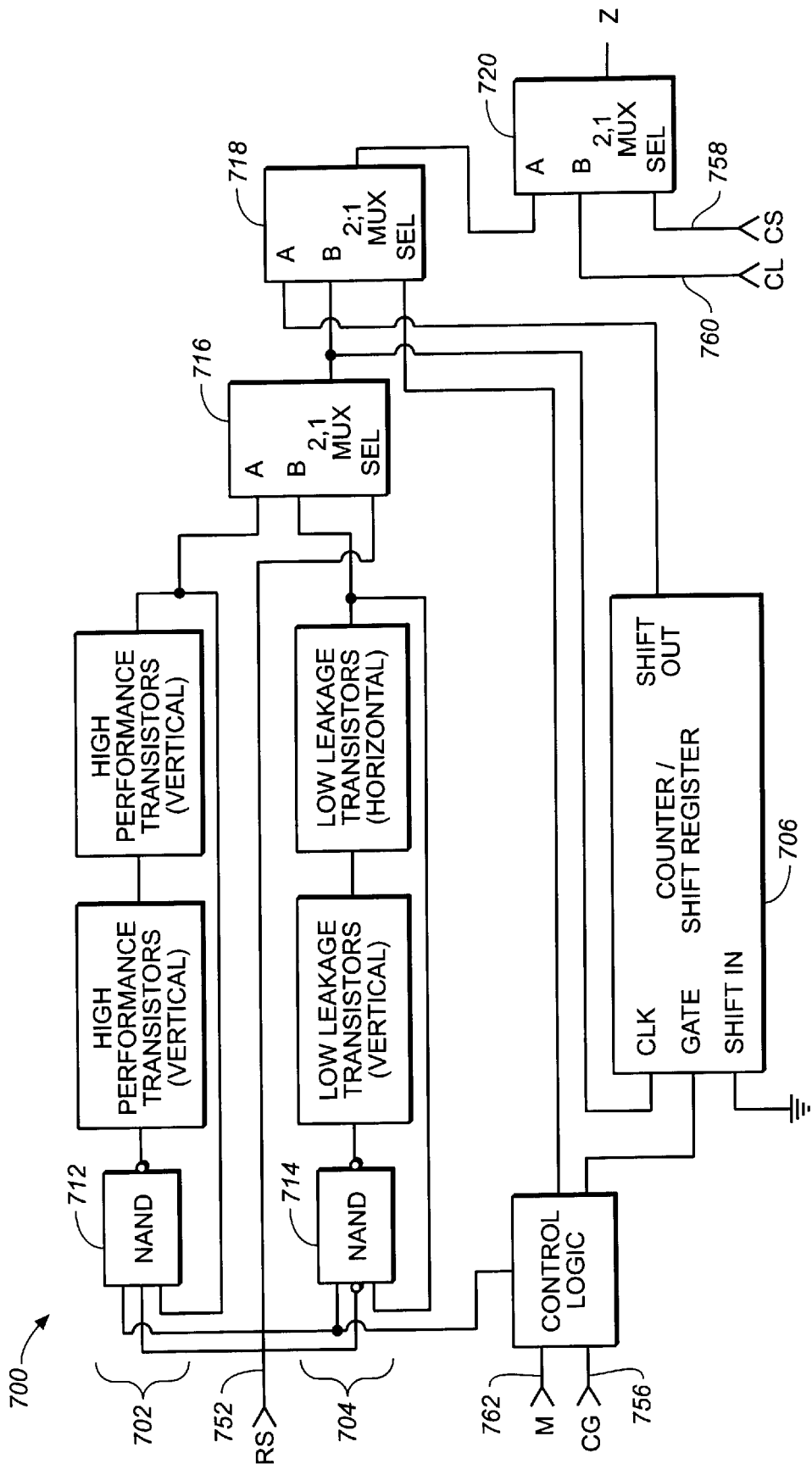
FIG._7

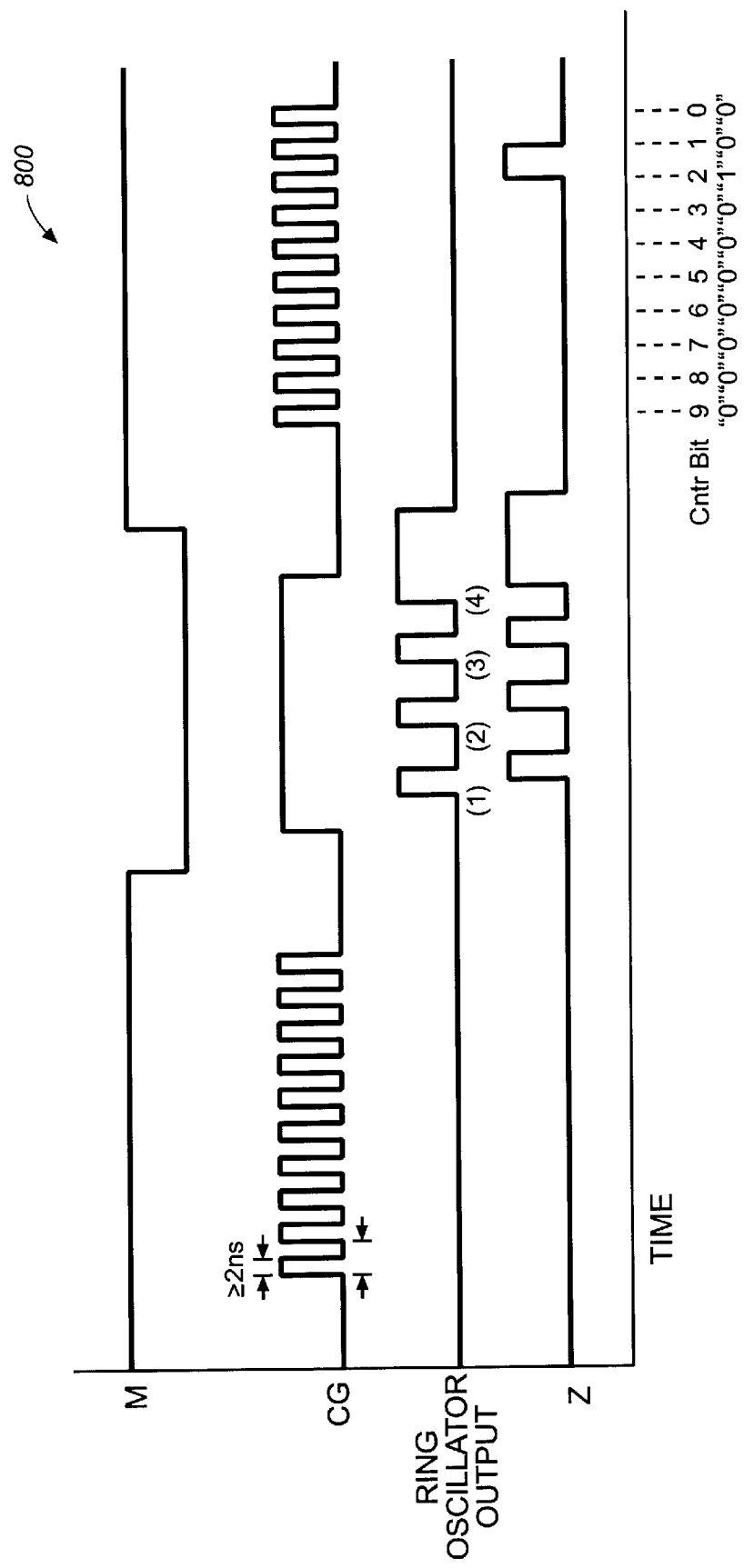
FIG._8

US 6,544,807 B1

PROCESS MONITOR WITH STATISTICALLY SELECTED RING OSCILLATOR

BACKGROUND OF THE INVENTION

The present invention relates generally to testing the performance of microelectronic circuits, and more specifically to process monitors using ring oscillators to measure the speed performance of each product die on a processed wafer.

Each product die on a processed wafer contains many circuits. A process monitor is a test circuit created on each die to track or measure the performance i.e., the propagation delay, of logic paths within the core of the product die. The performance measurements may be used to identify the position of the processed wafer in the performance distribution and/or to sort a die based on performance. A disadvantage of current tracking methods is that the gate structures or cell types used in the process monitor delay chain are not representative of those used in the die core. Another disadvantage is that metal loading is not incorporated into the process monitor measurements. A further disadvantage is that the measurements are subject to error due to internal and external loading. For example, the process monitor measurements are typically made of the width of pulses generated by the process monitor. The test probe used to sense the pulse and the routing of the process monitor output to the test probe may significantly distort the pulse shape. Reading the pulse width from the distorted pulse shape results in inconsistency and inaccuracy in the pulse width measurements.

SUMMARY OF THE INVENTION

The present invention advantageously addresses the needs above as well as other needs by providing a process monitor for measuring net chain delay.

In one embodiment, the present invention may be characterized as a process monitor that includes a test circuit formed on a product die wherein the test circuit has a distribution of cell types that is substantially identical to that of the product die.

In another embodiment, the present invention may be characterized as a method for process monitoring that includes the steps of generating pulses from a test circuit formed on a product die and counting the pulses output by the test circuit during a counting interval to measure a net chain delay of the test circuit wherein the net chain delay of the test circuit is representative of a net chain delay of a plurality of circuits formed on the product die.

BRIEF DESCRIPTION OF THE DRAWINGS

The above and other aspects, features and advantages of the present invention will be more apparent from the following more specific description thereof, presented in conjunction with the following drawings wherein:

FIG. 1 is a block diagram of a process monitor for measuring the period of a ring oscillator according to an embodiment of the present invention;

FIG. 2 is a pictorial diagram of the process monitor of FIG. 1 created on a processed wafer;

FIG. 3 is a schematic diagram of a logic stage for the ring oscillator of FIG. 1 and the net chain delay circuit of FIG. 4;

FIG. 4 is a schematic diagram of a net chain delay circuit incorporating the logic stage construction of FIG. 3;

FIG. 5 is a timing diagram for the test circuit of FIG. 4;

FIG. 6 is a layout illustrating vertical and horizontal transistor orientation for the ring oscillator of FIG. 1 or the test circuit for measuring net chain delay of FIG. 4;

FIG. 7 is a circuit design of the process monitor of FIG. 1; and

FIG. 8 is a timing diagram of the operation of the circuit design of FIG. 7.

Corresponding reference characters indicate corresponding components throughout the several views of the drawings.

DETAILED DESCRIPTION OF THE DRAWINGS

The following description is presented to disclose the currently known best mode for making and using the present invention. The scope of the invention is defined by the claims.

FIG. 1 is a block diagram of a process monitor 100 for measuring the period of a ring oscillator. Shown are a gating pulse 102, a ring oscillator 104, a pulse output 106, a feedback loop 108, a pulse counter 110, and a pulse count 112.

The ring oscillator 102 is connected to the pulse counter 110. The ring oscillator 104 may be made, for example, by connecting a delay chain of logic stages in series to generate a non-inverted pulse output 106 and feeding back the pulse output 106 to the input of the ring oscillator 104 by a feedback loop 108. The pulse counter 110 may be, for example, a ten-stage binary counter with serial input and serial output.

Asserting the gating pulse 102 enables the ring oscillator 104 to oscillate. The ring oscillator 104 oscillates at a frequency determined by the total propagation time of the pulse output 106 through the ring oscillator 104. The pulse counter 110 counts the number of pulses received from the pulse output 106 during the interval in which the gating pulse 102 is asserted. The number of logic stages used to make the ring oscillator 104 is selected to generate a pulse count that has the desired resolution for a selected gating pulse interval for measuring the performance of the product die 202.

When the gating pulse 102 is not asserted, the pulse counter 110 outputs the pulse count 112, for example, to an external display or a computer. After the pulse count is output, The pulse counter 110 is cleared for the next gating pulse 102. The test may be performed under any set of environmental conditions desired, and the pulse count will reflect the response of the integrated circuit to each set of conditions.

FIG. 2 is a pictorial diagram of the process monitor 100 of FIG. 1 created on a processed wafer. Shown are the processed wafer 200, a product die 202, and the process monitor 100. The processed wafer 200 has a number of circuits that comprise the product die 202 being manufactured. The propagation delay of the process monitor 100 is measured simply by reading the pulse count 112 and dividing the pulse count into the gating pulse interval. The propagation delay may be used to predict the performance that may be expected from product die 202 by well known computer simulation techniques without the cost and complexity of special test equipment.

FIG. 3 is a schematic diagram of an exemplary logic stage 300 for the ring oscillator of FIG. 1 or the net chain delay circuit of FIG. 4. Shown are a stage input 302, a logic element 304, an inverter 306 having symmetrical rise and fall delays, and a stage output 308. The logic element 304 is connected to the inverter 306 when the logic stage 300 is used in the net chain delay circuit of FIG. 4, however the inverter 306 is omitted when the logic stage 300 is used with the ring oscillator 104. The inverter 306 serves to separate N-channel transistor performance from P-channel transistor performance in the net chain delay circuit of FIG. 4. When a logic pulse is received at the stage input 302, the logic pulse propagates through the logic element 304 and is output from the inverter 306 with equal drive power for both rising and falling edges of the logic pulse. Maintaining symmetrical rise and fall delays in the logic pulses output from the inverter 306 allows delays dominated by P-channel transistors to accumulate for one passing edge polarity and delays dominated by N-channel transistors to accumulate for the other passing edge polarity. The performance of P-channel transistors may thus be evaluated separately from that of N-channel transistors.

The selection of the logic elements 304 used to make the stages 300 of the ring oscillator 104 or a net chain delay circuit is a significant departure from the prior art. Process monitors of the prior art use a logic element designed especially for the process monitor. In contrast to previous process monitors that use a logic element that differs from the logic elements used in the core of the product die 202, each logic element 304 is a duplicate of a logic element actually used in the core of the product die 202. Also, the logic elements 304 have a distribution of cell types that is the same as that used throughout the product die 202. For example, if the product die 202 had 1,000 NAND gates, 2,000 OR gates, and 7,000 multiplexers, then 10 percent of the logic elements 304 would be NAND gates, 20 percent would be OR gates, and 70 percent would be multiplexers. The logic elements 304 are preferably selected to be representative of small devices and/or long channel devices used in random-access memory (RAM) from the standard cell library included on the product die 202, of the combination of bent vs. straight transistors included on the product die 202, and of transistors dominated by point source/drain contacts included on the product die 202. The logic elements 304 may also be oriented so that 50 percent are oriented vertically and 50 percent are oriented horizontally to match the orientation of logic elements in the product die.

The cell layouts for each logic element 304 may use the library of standard cells, but these may not be available very early in the technology when a process monitor may be needed for test chip work. Alternatively, the cells may be laid out manually. Manual layout has the advantage of having control over the ratio of bent vs. straight gates and over other cell features. The inverter 306 requires a special layout to achieve the required symmetrical drive capability, i.e., the inverter 306 must have equal drive strengths for high and low level logic signals. The symmetry is achieved by selecting appropriate sizes for the transistors in the inverter 306.

Logic elements 304 should have loads representative of product die 202, for example, metal layers M1, M2, and M3, gate loading or fanout per stage of from 1 to 4, and have transistors in both vertical and horizontal orientations. For example, half of the logic stages 300 of the ring oscillator 104 or the net chain delay circuit of FIG. 4 may be made with transistors oriented vertically, and the other half with transistors oriented horizontally as shown in FIG. 6. Each half of the chain delay has a sufficient electrical length to ensure that the net chain delays or the ring oscillator periods are sufficiently long to permit accurate measurements with adequate resolution. The size of the process monitor 100 is thus determined by the required electrical length.

There are presently two types of transistors available for use in the product die 202, a high-performance transistor and a low-leakage transistor. The process monitor 100 may accommodate both types by incorporating separate ring oscillators for each type. Each ring oscillator 104 may be partitioned into two identical halves, where one half is rotated 90 degrees with respect to the other half. The partitioning takes into account any differences in the transistor critical dimensions, or "poly CD", between horizontally and vertically formed transistors.

An important function of a process monitor is to provide a vehicle for monitoring the correlation between SPICE simulation and silicon and to check for possible drifts in the process due to changes in, for example, poly CD, gate oxide thickness, source/drain doping levels, and metal oxide thicknesses. The robustness of a transistor model is measured by its ability to predict performance over a wide range of logic functions, transistor sizes, and loading. Because of the many variations of gate types in the delay chain, it may not be possible to isolate certain gate types as possible model correlation offenders, but the average delay is a good model correlation point because it is reasonably representative of the logic used in the product die 202.

FIG. 4 is a schematic diagram of a net chain delay circuit 400 incorporating the logic stage construction of FIG. 3. As an alternative to the ring oscillator 104 of FIG. 1, the net chain delay circuit 400 may be used to measure die performance. Shown are a pulse input 402, a buffer 404, a non-inverting delay chain 406, a net chain path 408, a metal path 410, a multiplexer 412 having inputs A and B, a multiplexer enable 414, and a multiplexer output 416. The pulse input 402 is connected to the buffer 404. The buffer 404 is connected to the delay chain 406 and to the metal path 410. The delay chain 406 is connected to net chain path 408. The net chain path 408 and the metal path 410 are connected to multiplexer 412. The metal chain path 410 has a length selected to match that of the net chain path 408.

The delay chain 406 comprises several stages of logic elements constructed from N-channel and P-channel transistors. The design of the multiplexer 412 is such that the difference in delay between the A and B inputs through the multiplexer 412 is 5 ps or less.

In operation, the input pulse 402 is buffered by the buffer 404 and output to the delay chain 406 and the metal path 410. The buffered input pulse is delayed by the delay chain 406 and output to the net chain path 408. The buffered input pulse also propagates along the metal path 410. When the multiplexer enable 414 is set at a logic "0", the multiplexer 412 outputs the buffered input pulse from net chain path 408 at the multiplexer output 416. When the multiplexer enable 414 is set at a logic "1", the multiplexer 412 outputs the buffered input pulse from the metal path 410 at the multiplexer output 416. Because the metal path 410 has the same length as the net chain path 408, the delays of the buffered input pulse between the net chain path 408 and the metal path 410 may be measured and subtracted to give the delay due solely to the transistors of the delay chain 406.

FIG. 5 is a timing diagram 500 for the test circuit 400 for measuring net chain delay of FIG. 4. Shown are plots 502, 504, and 506 for the multiplexer enable 414, the input pulse 402, and the multiplexer output 416 respectively, a rising edge reference delay $TR_{REF}$ 510, a falling edge reference delay $TF_{REF}$ 512, a rising edge delay TR 514, and a falling edge delay TF 516.

Reference delays through the metal path 410 are first measured with the multiplexer enable set at a logic "1", which enables the B input of the multiplexer 412. Comparing the input pulse plot 504 with the multiplexer output plot 506 gives the rising edge reference delay $TR_{REF}$ 510 and the falling edge reference delay $TF_{REF}$ 512.

Next, net chain delays are measured by setting the multiplexer enable 414 at a logic "0", enabling the A input. Comparing the portion of input pulse plot 504 with the multiplexer output plot 506 with the multiplexer enable 414 at a logic "0" gives the rising edge delay TR 514 and the falling edge delay TF 516. If care is taken in the layout of the test circuit 400 to ensure that the length of net chain 408 is the same as the length of metal path 410, then the total delay due solely to the delay chain 406 itself for a rising edge of the pulse input 402 is given by $TR-TR_{REF}$ and for a falling edge of the pulse input 402 by $TF-TF_{REF}$. If the delay chain 406 is designed such that $TR-TR_{REF}$ is dominated by P-channel transistor performance and $TF-TF_{REF}$ is dominated by N-channel transistor performance (or vice versa), then the transistor performance of each channel type is given by the net chain delay calculations described.

The net chain delays are free from error introduced by downstream cells and their loading because the difference of two delays measured to the same edge polarity eliminates any measurement error due to pulse widening and narrowing. Incidental delays not related to the delay chain 406 itself are nulled out. The only opportunity for introducing measurement error would be if the delays through the multiplexer 416 from the A and B inputs or the transition times at the A and B inputs were significantly different. For a properly designed multiplexer, the delay difference between inputs is 5 ps or less, and the transition times may be controlled and matched by well known layout techniques and cell selection.

When instantiated on the product die 202, the delays from the net chain path 408 and the metal path delay 410 cannot be measured directly from the input pulse 402 because it is an internal node, therefore the delays must be measured from the die or package pin that ultimately drives the internal node. The added delays caused by additional gates between the die or package pin an the internal node are of no consequence, however, because the extra delays are nulled out when the difference between the reference metal path and the chain delay path is calculated. The calculation of the delay differences also nulls out any delays between the multiplexer 416 and the package pin connection.

FIG. 6 is a layout 600 illustrating vertical and horizontal transistor orientation for the ring oscillator 104 of FIG. 1 or the net chain delay test circuit 400 of FIG. 4. Shown are the buffer 404 and the multiplexer 412 of FIG. 4, a horizontal transistor orientation 602, a vertical transistor orientation 604, metal loading 606, and fanout loading 608. The horizontal transistor orientation 602 and the vertical transistor orientation 604 depict the layout for the logic stages 300 described above for FIG. 3. The metal loading 606 adds capacitance between logic stages 300. The fanout loading 608 provides an average loading per stage for the process monitor that matches that of the product die 202.

FIG. 7 is an exemplary circuit design 700 that may be used for the process monitor 100 of FIG. 1. Shown are a high-performance transistor ring oscillator 702, a low-leakage transistor ring oscillator 704, a pulse counter 706, NAND gates 712 and 714, multiplexers 716, 718, and 720; an RS input 752, a CG input 756, a CS input 758, a CL input 760, a M input pin 762, and a Z output 764.

In operation, the ring oscillators 702 and 704 output pulses to the pulse counter 706. The NAND gates 712 and 714 enable one of the ring oscillators 702 and 704 in response to the RS input 752. The pulse output from the enabled one of the ring oscillators 702 and 704 is selected by the multiplexer 716 and received as input by the pulse counter 706 in response to a gating pulse at the CG input 756. The pulse counter 706 counts the pulses during the gating pulse. After the pulses are counted, clock pulses at the CG input 756 clear the pulse counter 706 while the number of pulses counted is output serially to the multiplexer 718. Alternatively, an asynchronous reset could be used to clear the pulse counter 706. Multiplexer 720 selects either the serial output of the pulse counter 706 or the product die logic signal CL 760 in response to the select signal CS 758 to be output at the process monitor output Z 764. Table 1 below is a further description of the pins labeled in FIG. 7.

TABLE 1

| PIN | TYPE | FUNCTION |
| --- | --- | --- |
| M | Input | Logic "1" sets counter scan (read-and-clear) mode<br>Logic "0" sets ring oscillator mode |
| RS | Input | Logic "0" enables the ring oscillator 704<br>Logic "1" enables the ring oscillator 702 |
| CS | Input | Logic "0" selects process monitor at output Z<br>Logic "1" selects product die logic signal at output Z |
| CL | Input | Product die logic input for output at Z if CS is "1" |
| CG | Input | If M is "0", clock pulses read and clear the counter<br>If M is "1", a gating pulse gates the enabled ring oscillator |
| Z | Output | If CS is "0", outputs number of pulses counted<br>If CS is "1", outputs product die logic signal |

The Z output 764 should drive an I/O buffer directly. There are no restrictions on what I/O buffer is used to drive the signal off-chip, however, the signal from the process monitor 100 is preferably passed to the I/O pin with no inversion to maintain conventional zeroes and ones format for the serially output pulse count.

When in the scan or read-and-clear mode, the pulse counter 706 is reconfigured as a positive-edge triggered shift register, i.e., the shift occurs on the rising edge of the CG input 756. The shift register has a master-slave design, therefore the timing of the falling edge is not important. There is no lower limit to the allowable clock frequency for the circuit design of FIG. 7.

The ring oscillators 702 and 704 preferably include as much metal capacitance as possible to match the ratio of metal delay to total delay found in the core of the product die 202. By controlling the placement and forcing the place and route tool to follow the placement with the routing, all nodes will have non-minimum metal capacitance. All of the routing tracks should be used, or at least as many as possible. Routing tracks that are unoccupied or left partially unoccupied by metal after routing the delay chains should be filled with dummy metal tied to VSS. Metal blockages should be placed entirely over the ring oscillators 702 and 704 on all layers to prevent any core logic nets from being routed over them.

The periods of the ring oscillators 702 and 704 should be made as large as possible. Currently available silicon data indicates that the larger the period, the higher the correlation with other logic paths. Because the period is proportional to physical size, an upper bound on the period is established by specifying the maximum allowable size. Alternatively, the physical size may be reduced by reducing the oscillator period.

The pulse counter 706 has ten stages, which allows 1024 ring oscillator periods to be counted before overflow. In this example, no overflow indication is provided, therefore the width of the gating pulse should be selected to ensure that no overflow occurs. Ten stages represent a reasonable compromise between physical size and measurement resolution. Reducing the physical size by reducing the number of bits may reduce the resolution to an unacceptable level.

FIG. 8 is a timing diagram 800 of the operation of the circuit design 700 of FIG. 7. Shown are the logic level sequences for the M input pin 762, the CG input pin 756, the output of one of the ring oscillators 702 and 704, and the Z output 764 sequence for a complete test of four ring oscillator periods. The CS input 758 is set to logic "0" to enable the number of pulses counted to be output from the process monitor 100. The RS input 752 is set to logic "0" to enable the ring oscillator 702 or to logic "1" to enable the ring oscillator 704.

In the timing diagram of FIG. 8, the M input 762 is set to logic "1", and ten clock pulses are presented at the CG input 756 to clear the pulse counter 706. The M input 762 is then set to logic "0", and the rising edge of a gating pulse is presented at the CG input 756 to generate the ring oscillator pulses from the ring oscillator 702 or 704. In this example, four ring oscillator pulses have been output to the pulse counter 706 while the gating pulse is asserted. The M input 762 is then set to logic "1", and ten clock pulses are presented at the CG input 756. The pulse counter 706 shifts out 1 bit of the total number of output pulses counted with each clock pulse, and on the eighth clock pulse, the bit representing the count of four is output as a logic "1", while all other bits are a logic "0". As each bit is shifted out of the pulse counter 706, the corresponding counter stage is cleared for the next count. The measurement may be repeated for the same ring oscillator 702 or 704, or the RS input 752 may be toggled to test the other ring oscillator 702 or 704. The pulses output from the ring oscillator may also be monitored at the Z output 764 during the gating pulse.

A process factor Kp may be calculated from the formula Kp=simulated count+measured count, where the simulated count is the prediction of a SPICE simulation using nominal transistor models. A Kp value of 1.0 means that the product die 202 is "nominal", i.e., exactly as predicted by the SPICE simulation. A Kp value of less than one means that the product die 202 is on the fast end of the process distribution, and a Kp product of less than one means that the product die 202 is on the slow end of the process distribution.

While the invention herein disclosed has been described by means of specific embodiments and applications thereof, numerous modifications and variations could be made thereto by those skilled in the art without departing from the scope of the invention defined by the following claims.

What is claimed is:

1. A process monitor comprising:
a test circuit formed on a product die having a distribution of cell types that is substantially identical to that of a plurality of circuits formed on the product die wherein the test circuit comprises a net chain delay circuit.

2. A process monitor comprising:
a test circuit formed on a product die having a distribution of cell types that is substantially identical to that of a plurality of circuits formed on the product die wherein the test circuit has an average metal loading per stage that is substantially identical to that of the product die.

3. A process monitor comprising:
a test circuit formed on a product die having a distribution of cell types that is substantially identical to that of a plurality of circuits formed on the product die; and
a metal path having a length substantially equal to that of the test circuit for nulling out metal path delay.

4. A process monitor comprising:
a test circuit formed on a product die having a distribution of cell types that is substantially identical to that of a plurality of circuits formed on the product die wherein the test circuit is routed to maximize metal path length for measuring the effects of over-etching and under-etching.

5. The process monitor of claim 1 wherein the test circuit comprises a first portion wherein net chain delay is determined by a first type of transistor and a second portion wherein net chain delay is determined by a second type of transistor.

* * * * *